(12) United States Patent
Seeli et al.

(10) Patent No.: US 7,025,863 B2
(45) Date of Patent: Apr. 11, 2006

(54) VACUUM SYSTEM WITH SEPARABLE WORK PIECE SUPPORT

(75) Inventors: Roger Seeli, Truebbach (CH); Mauro Pedrazzini, Eschen (LI); Volker Derflinger, Feldkirch (AT)

(73) Assignee: Unaxis Balzers Limited, Balzers (LI)

( * ) Notice: Subject to any disclaimer, the term of this patent is extended or adjusted under 35 U.S.C. 154(b) by 570 days.

(21) Appl. No.: 09/947,454

(22) Filed: Sep. 5, 2001

(65) Prior Publication Data
US 2002/0053322 A1 May 9, 2002

(30) Foreign Application Priority Data
Sep. 5, 2000 (CH) .............. 2000 1727/00

(51) Int. Cl.
*H01L 21/00* (2006.01)
*C23C 16/00* (2006.01)

(52) U.S. Cl. ............... 204/298.41; 204/192.38; 118/723 MP; 118/723 R; 219/121.11; 219/121.15

(58) Field of Classification Search ......... 118/723 MP, 118/723, 728, 723 R; 204/298.41, 192.38; 219/121.11, 121.15
See application file for complete search history.

(56) References Cited

U.S. PATENT DOCUMENTS

| | | | |
|---|---|---|---|
| 4,673,477 A * | 6/1987 | Ramalingam et al. . | 204/192.38 |
| 5,192,578 A * | 3/1993 | Ramm et al. ............... | 427/576 |
| 5,216,223 A * | 6/1993 | Straemke ............... | 219/121.43 |
| 5,709,784 A | 1/1998 | Braendle et al. ........ | 204/192.38 |
| 5,885,355 A * | 3/1999 | Song et al. ................. | 118/719 |
| 6,056,850 A * | 5/2000 | Blalock et al. ......... | 156/345.27 |

FOREIGN PATENT DOCUMENTS

| DE | 33 30 144 | 3/1984 |
|---|---|---|
| DE | 2823876 | 4/1984 |

* cited by examiner

*Primary Examiner*—Ram N Kackar
(74) *Attorney, Agent, or Firm*—Cahill von Hellens & Glazer, P.L.C.

(57) ABSTRACT

A vacuum system for the treatment of work pieces has an evacuatable treatment chamber having a centrally disposed low voltage arc discharge arrangement and laterally disposed loading opening. A coupling device between the work piece support and a receiving device on the system side allows simplified loading and removal of the work pieces to be treated along with the support by simply lifting onto or lowering from the receiving device.

25 Claims, 3 Drawing Sheets

VACUUM SYSTEM WITH SEPARABLE WORK PIECE SUPPORT

BACKGROUND OF THE INVENTION

The present invention relates to a vacuum system for the treatment of work pieces having an evacuatable treatment chamber in whose central axis a low voltage arc discharge arrangement is disposed and at least one coating source attached to one lateral wall of the treatment chamber, as well as a work piece support on which work pieces can be mounted.

It is known in the art of vacuum coating to perform cleaning and/or heating steps for various vacuum treatment processes before and/or after vacuum coating. Such steps are particularly necessary in order to give a deposited layer a good adhesive strength. This is especially important for applications where work pieces, particularly tools and parts subject to high mechanical stresses, are to be coated with a wear-resistant hard coating. Such coatings are often used in making tools, for example drills, milling cutters, and shaping tools, and in making parts such as toothed gears, needles for injection nozzles, cup tappets, cam shafts, and other fast-moving or highly-stressed parts that are exposed to particularly high mechanical and abrasive stresses. An extremely good adhesion with the base is therefore a prerequisite for serviceable, economical use. A proven method of pre-treating such work pieces is, on the one hand, heating, particularly with electron bombardment, as well as etching using ion etching or sputter etching. Heating using electron bombardment from a plasma discharge has, for example, is known from German Patent No. DE 33 30 144. A plasma discharge path can also be used to produce heavy noble gas ions, for example argon ions, which can be accelerated out of that plasma onto the work piece or the substrate in order to cause sputter etching there, as described in German Patent No. DE 28 33 876. In addition to sputter etching, it is also known to operate plasma discharges with additional reactive gases, and to etch the work pieces with reactive chemistry, with mixed forms of such reactive etching and sputter etching also being possible.

In the aforementioned processes, the treatment chamber is often surrounded by an electromagnetic coil arrangement, preferably of the Helmholtz coil pair type, which makes it possible to further influence the plasma, for example to increase the plasma density or to concentrate the plasma, which causes a stronger ion bombardment, or to control the plasma distribution in the device, for example by changing the coil currents during plasma treatment and the like.

In all of these pretreatment processes, the work piece surface is prepared in such a way that the subsequent coating will adhere well to the base. In producing a plasma in the aforementioned treatments, a low voltage arc discharge is disposed along the central axis of the treatment chamber, with the work pieces being disposed at a specific distance from such central axis and along a cylindrical surface. The coating is then done by means of thermal evaporation or cathode sputtering, or mixed forms thereof, such as arc evaporation. Depending on process control, an additional ion bombardment can be produced during coating by a corresponding substrate bias, which is known by the term "ion plating."

The above-described method has the advantage that large ion flows can be produced, with lower particle energy, from the low voltage arc discharge, and therefore the work piece can be treated gently. However, the need to arrange the work pieces to be coated so that they can be moved around a device attached centrally in the system for ignition of a low voltage arc, which is necessary in such processes, results in a relatively complex mechanical structure. For example, in current practice, parts to be coated are often fastened on individual work piece holders that are disposed symmetrically around the system axis, or rotatably mounted on carousel-like work piece supports. Moreover, to carry out the various process steps, different electrical potentials must be applied to the centrally disposed anode and the individual work piece holders (or the work piece support), and these components must be electrically insulated from each other and additionally from the grounded system. In some instances, it is necessary to provide additional electrical lead-throughs into the treatment chamber for temperature sensors or other measurement devices. Based on the complex mechanical and electrical requirements described above, known industrial equipment used to simultaneously coat a large number of parts (or to coat a smaller number of individual heavy parts) include work piece holders or carousel-like work piece supports that are connected rotatably with the vacuum chamber (typically, with the bottom of the vacuum chamber; however, in such known systems, the work pieces (and/or the work piece supports) can not be simply separated from the vacuum chamber. Therefore, loading and unloading of the work pieces through a lateral opening is consequently difficult, especially due to the centralized position of the low voltage arc discharge arrangement.

Accordingly, in large-scale industrial applications, an arrangement was chosen in which the bottom of the evacuation chamber, including the work piece support mounted thereto, is lowered away from the rest of the evacuation chamber during loading/unloading operations, either hydraulically or using spindle drives. Alternatively, it would be conceivable to leave the bottom of the evacuation chamber fixed in place, and to instead raise the balance of the evacuation chamber upward. Common to both such arrangements is the detrimental need to provide all supply lines (such as cold water and electricity) that are connected to the movable chamber bottom (or to the movable chamber, in the case of the alternate arrangement) in a costly movable design. The necessarily larger vertical height of such devices, and the longer down-time of such devices during loading and unloading operations, are also uneconomical.

In an effort to address such disadvantages, U.S. Pat. No. 5,709,784 discloses a system that is particularly appropriate for large-scale industrial mass production. The apparatus described in the '784 patent discloses PVD (physical vapor deposition) devices with low voltage arc discharge systems wherein the processing width for the work pieces can be up to 1,000 mm. and more, and which include simplified front loading and unloading of the work pieces. To achieve that goal, that apparatus disclosed in the '784 patent includes at least one low voltage arc discharge system that is attached laterally to the evacuation chamber, extending generally parallel to a moveable work piece support. However, while this asymmetrical arrangement of the low voltage arc discharge system provides handling advantages of the work pieces in comparison with a centralized arrangement of the low voltage arc discharge system, such handling advantages are offset by limitations imposed by geometrical considerations.

SUMMARY OF THE INVENTION

The aim of the present invention is therefore to avoid the aforementioned disadvantages of the state of the art, and also to shorten treatment times for work pieces in a vacuum treatment system (particularly, to shorten down time for the system), to simplify construction, and to achieve greater economic efficiency.

These aims are achieved by the present invention in that the work piece support is separably linked to a receiving device that extends through the bottom of the treatment chamber, and in that the treatment chamber has a closeable lateral opening, preferably formed on the front side of the treatment chamber. The cross section of such lateral opening is greater than the cross section of the work piece support; accordingly, the work piece support, together with its associated work piece holders and corresponding work pieces, can be quickly uncoupled from the aforementioned receiving device and removed from the treatment chamber. A low voltage arc discharge system extends through the receiving device along the central axis of the treatment chamber. Preferably, the receiving device is rotatable relative to the bottom of the treatment chamber.

The use of the central low voltage arc discharge arrangement allows etching or ion-supported coating from the central axis of the treatment chamber with all the aforementioned advantages of a symmetrical arrangement for such a vacuum coating system. In addition, further advantages are provided by the symmetry of optional magnetic plasma focusing. The separable coupling formed between the work piece support and the receiving device allows rapid loading and unloading of the work piece support, largely due to the preferred lateral opening in the treatment chamber.

In one embodiment, guidance/linking devices are provided on the work piece support corresponding with equivalent, but opposite, guidance/linking devices formed upon the receiving device of the vacuum system. When unloading the work piece support from the treatment chamber, the coupling between the work piece support and the receiving device is separated by raising the work piece support above the receiving device in the vacuum system, for example, by using an appropriate lifting device. Conversely, a separable link is produced during the loading process by lowering the work piece support onto the receiving device in the treatment chamber. In a preferred embodiment, the guiding/linking devices that form the separable coupling include guide pins, preferably self-centering mandrels, formed upon the work piece support which engage corresponding recesses, preferably bore holes, formed within the receiving device. In an alternate embodiment, the mandrels are formed upon the receiving device, and the bore holes are formed within the work piece support; alternatively, combinations of mandrels and bore holes may be formed on both the work piece support and the receiving device. Preferably, the guide pins and recesses are arranged asymmetrically to ensure a clear positioning of the work piece support upon the receiving device. The work piece support, in accordance with one embodiment of the invention, is rotatably supported by the receiving device about the central axis of the treatment chamber.

The ability to rotate the receiving device, thereby rotating the work piece support about the central axis of the treatment chamber, is also advantageous for use in a vacuum coating system. A motor drive can advantageously be coupled to the receiving device, outside the treatment chamber, to move the work pieces to be treated in front of coating/etching sources in order to allow a uniform treatment of such work pieces. Optionally, additional work piece holders, which in turn can be constructed as carousels, can be provided upon the work piece support.

In a preferred embodiment, the present invention includes a hollow shaft that extends perpendicular to the bottom of the treatment chamber; the upper end of such shaft extends within the treatment chamber and supports the receiving device. The lower end of such hollow shaft is located in the atmospheric area, and a vacuum-tight rotating lead-through is formed between the hollow shaft and the bottom of the treatment chamber using known sealing devices. Advantageously, the motor drive can be maintained outside the treatment chamber for ease of maintenance. Also, measurement, control, and supply lines (e.g., power supply, bias voltage, measurement lines, and cooling medium) can be routed into the treatment chamber through the hollow shaft. The hollow, rotating shaft may itself serve as an electrical connection; this can be achieved, for example, by using rubbing, sliding, or spring-biased electrical contacts.

In accordance with an additional embodiment of the invention, the vacuum system includes a gas cooling/heating system for the treatment chamber which allows a gas to be admitted through a gas inlet into the treatment chamber and to circulate actively therein. Parts of the pre-vacuum production device can also be used for gas circulation. The cooling/heating effect on the work pieces is simply achieved by disposing a gas heat exchanger in the circulation system; the gas heat exchanger draws heat from, or adds heat to, the gas circulated into the treatment chamber. Heat absorbed by the heat exchanger can be transferred away in a known manner, using water or air as a heat transfer medium; heating can be done electrically. Possible gases that might be introduced into the treatment chamber include helium, nitrogen, forming gas (nitrogen with a low percentage of hydrogen), or other gases known in the art. A pressure regulation device can be used to ensure a desired pressure range between substantially 100 mbar up to atmospheric pressure, approximately 800 mbar.

In a further advantageous embodiment, mechanical or electromechanical devices can be provided on the work piece holder, on the receiving device, or on other appropriate parts of the system, which devices make it possible to determine or maintain a defined loading and unloading position for the work piece holder and receiving device. Such a position can be adjusted using a motor and an associated control circuit. As an example, limit switches, inductive proximity switches, mechanical stops, or generically related devices can be used to control the loading/unloading position of the work piece holder and/or receiving device.

The electrical connections for substrate bias or measurement lines, for example, can in accordance with an additional embodiment, be produced over contacts that can be correspondingly provided in the receiving device and the work piece holder. These can preferably be produced as rubbing, sliding, or spring. Depending on the construction of the guidance/linking devices that are used to separably link the work piece support and the receiving device, the media connections (for water cooling, etc.) can be in the form of a point-to-point contact or a point-to-axisymmetrical ring-shaped surface contact or other known embodiments.

A further advantageous embodiment involves providing the anode as an integral part of the receiving device, electrically insulated from it. An anode attached centrally on the rotating axis of the receiving device is a particularly simple design; the anode can be constructed so that it rotates along with the receiving device without adversely impacting its function. Depending on the embodiment, the anode can be disposed below or above the receiving device. When positioned above the receiving device, the anode can include an upper detachable portion, or "head". The ability to remove the anode head results in advantages for maintenance and system cleaning.

The medium needed for cooling the anode, preferably cooling water, can be fed through a centrally-disposed feeding tube which passes through the aforementioned hollow shaft and into the anode head. A second, outer co-axial evacuation tube that surrounds the feeding tube can be used to subsequently evacuate the cooling medium from the anode head. Feeding and evacuation advantageously use rotatable coupling elements fastened on the lower atmosphere-side end of the anode. In addition, depending on whether the entire anode remains in the device during the loading process or whether at least the anode head with the work piece support is removed from the device, an additional coupling of the feed or evacuation of the cooling medium can be provided, which coupling is automatically activated by lowering or raising the work piece support.

In an additional advantageous embodiment, plasma formed within the treatment chamber can be influenced by surrounding the treatment chamber with magnetic coils of the Helmholtz coil pair type. An additional advantage results when at least one of the coils, preferably the lower one, which is smaller in diameter, is applied on the outside of the system bottom, concentrically around the hollow shaft of the drive axis. This makes it possible to arrange the lateral loading/unloading opening of the treatment chamber more flexibly. Surprisingly, the capability of influencing the plasma is hardly disrupted by this changed dimensioning. An additional embodiment makes it possible for the coil with a smaller dimension to be constructed with more windings and therefore to gain an additional capability for magnetic field adjustment. A separate current/voltage supply for the lower coil with individual control would also be possible.

DETAILED DESCRIPTION OF THE PREFERRED EMBODIMENTS

Figure 1:
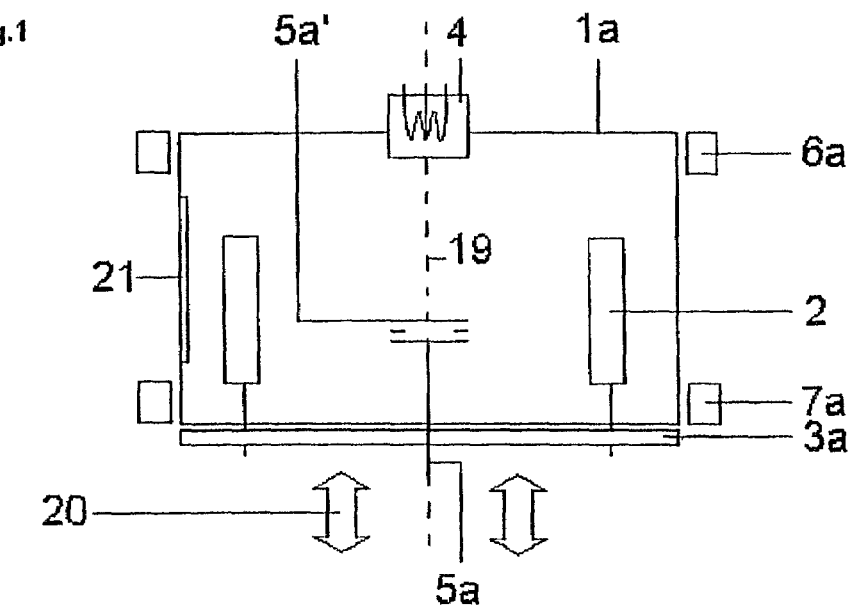
FIG. 1 shows a known vacuum system having a central, symmetrical low voltage arc discharge device.

FIG. 1 shows a schematic representation of a vacuum coating device for large-scale industrial application according to the state of the art. Ionization chamber 4 and anode 5 are disposed along central axis 19 of treatment chamber 1a. The anode 5 can either be introduced from below through the system bottom as shown in 5a or from above as shown in 5a'. For stabilization of the low voltage arc, an upper coil 6a and a lower coil 7a are additionally attached to the system. The rotatably-supported work piece holders 2 are either fastened directly on the system bottom, constructed as a loading opening 3a, or on a work piece support (not shown) that is also rotatably-mounted on loading opening 3a. This makes it possible for the loading and unloading process (symbolically shown by the movement arrow 20) to be carried out merely by shifting the loading opening 3a downward. The resulting disadvantages are a high overall height of the device and a corresponding space requirement, as well as a more complicated, time-consuming loading and unloading process. The same applies to a variation (not shown) in which the treatment chamber is moved upward for the loading and unloading process, while the bottom of the treatment chamber remains fixed. Another disadvantage for both variations is the resulting need for all supply lines (cooling water and electricity) that are coupled to a moving element to be provided in a costly movable design.

Figure 2:
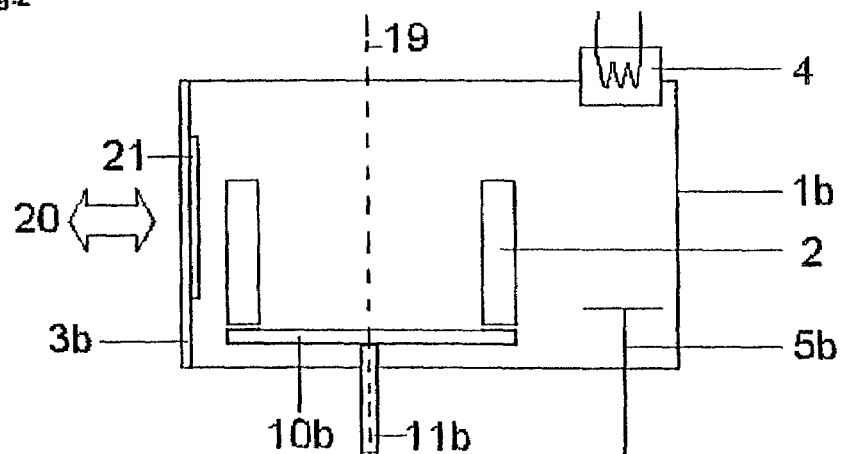
FIG. 2 shows a second known vacuum system having an asymmetrical low voltage arc discharge arrangement.

FIG. 2 shows a vacuum system having a low voltage arc discharge arrangement with a simple front loading and unloading opening 3b. At least one low voltage arc discharge arrangement, including ionization chamber 4 and anode 5b, is attached laterally on treatment chamber 1b, parallel to work piece holders 2 which are movably attached to a work piece support 10.

Figure 3:
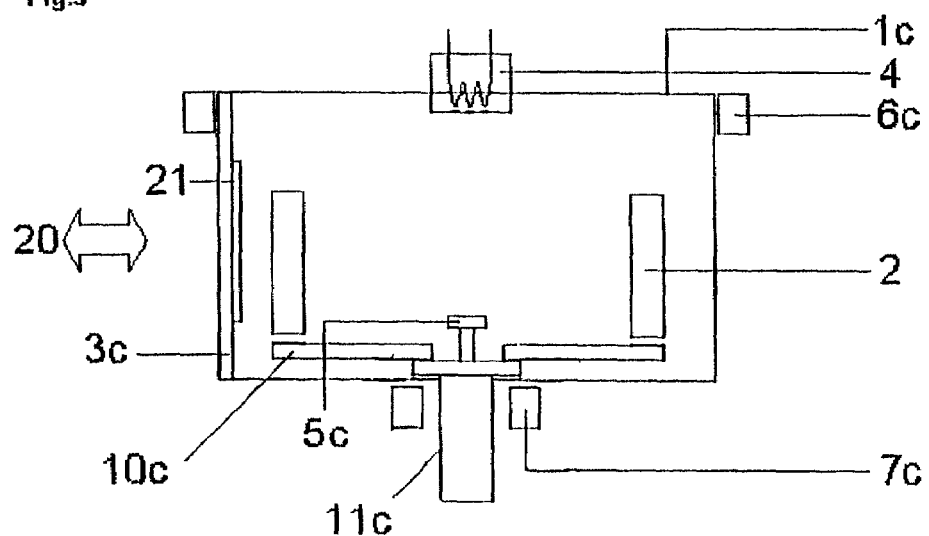
FIG. 3 illustrates an embodiment of a vacuum system constructed in accordance with the present invention.

FIG. 3 shows a schematic view of a vacuum treatment system in accordance with the present invention having a treatment chamber 1c, a low voltage arc discharge device including ionization chamber 4 and anode 5c, upper coil 6c and lower coil 7c, evaporation source(s) 21, work piece support 10c, and work piece holder 2 disposed along central axis 19, and a loading opening 3c accessible from the front of treatment chamber 1c. Additional known system components such as a vacuum pump stand, gas supply, measurement tubes, regulation and control devices, and operator elements are not shown here in greater detail.

Figure 4:
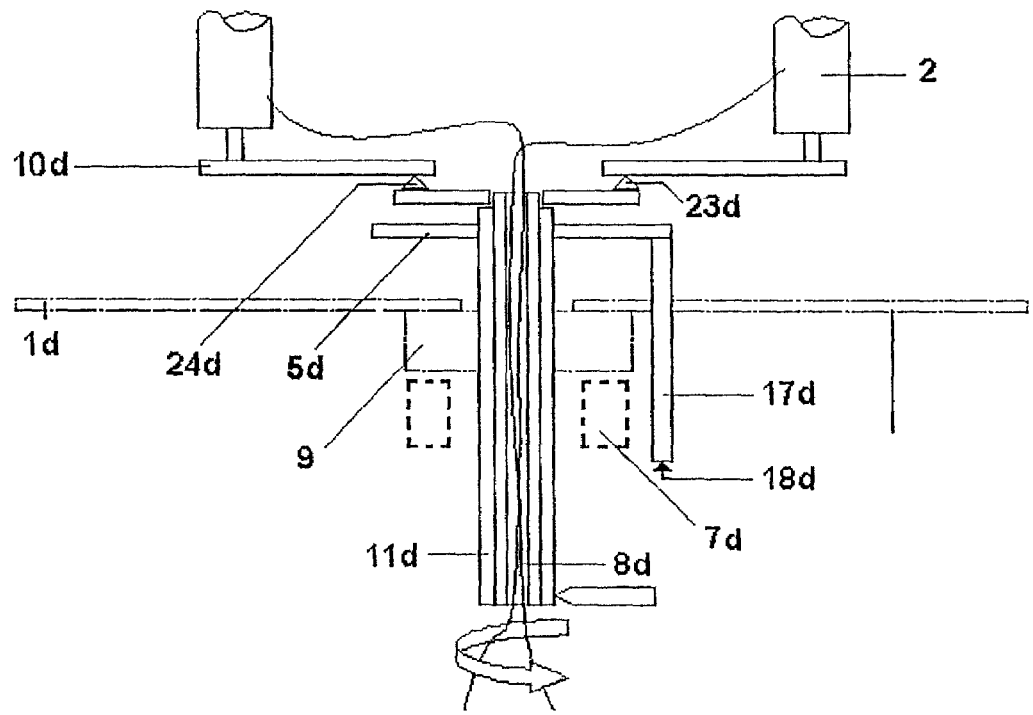
FIG. 4 is a more detailed illustration of the vacuum system shown in FIG. 3 and including an anode positioned below a receiving device base plate.

To ensure an effective and yet easily separable media supply (substrate voltage as well as, if necessary, various measurement voltages on the work piece support, anode voltage, and cooling water onto or into the anode), with vacuum-tight transition into the treatment chamber in spite of the rotatably supported work piece support, various inventive solutions were provided which are described in the following figures. Common to all embodiments is that work piece support 10 is separable from the treatment chamber by simple lifting, using a known lifting device (not shown in greater detail here), such as a fork lift, from base plate 24 (which is provided with bearings 23, as shown in FIG. 4). Work piece support 10 can be unloaded from treatment chamber 1c with work piece holders 2, as well as coated work pieces, fastened on it. In that regard, it is sufficient to raise the lower edge of work piece support 10c with sufficient play over the upper edge of anode 5. Overall, only a few centimeters, up to a maximum of about one decimeter, of lift, relative to the coupled position, is necessary to separate work piece support 10c from the treatment chamber.

The embodiment of the invention shown in FIG. 4 shows a concept that is mechanically simple to achieve. Anode 5d is attached under base plate 24d (or under work piece support 10d) so cooling water line 18 and anode current supply 17d can be eccentric, or offset from the central axis. This has the advantage that more room for the other media lines remains in hollow shaft 11d. In this embodiment, it is important that base plate 24d and/or work piece support 10d are constructed in such a way that the low voltage arc can burn with as little disturbance as possible from the ionization chamber 4 (not shown here in greater detail) onto anode 5d. For example, this is made possible by providing spokes on base plate 24d and/or work piece support 10d. To prevent excessive etching removal from such installed structures (which are exposed to the low voltage arc), they are advantageously protected with metal sheets insulated from the bias potential and applied to ground potential.

Figure 5:
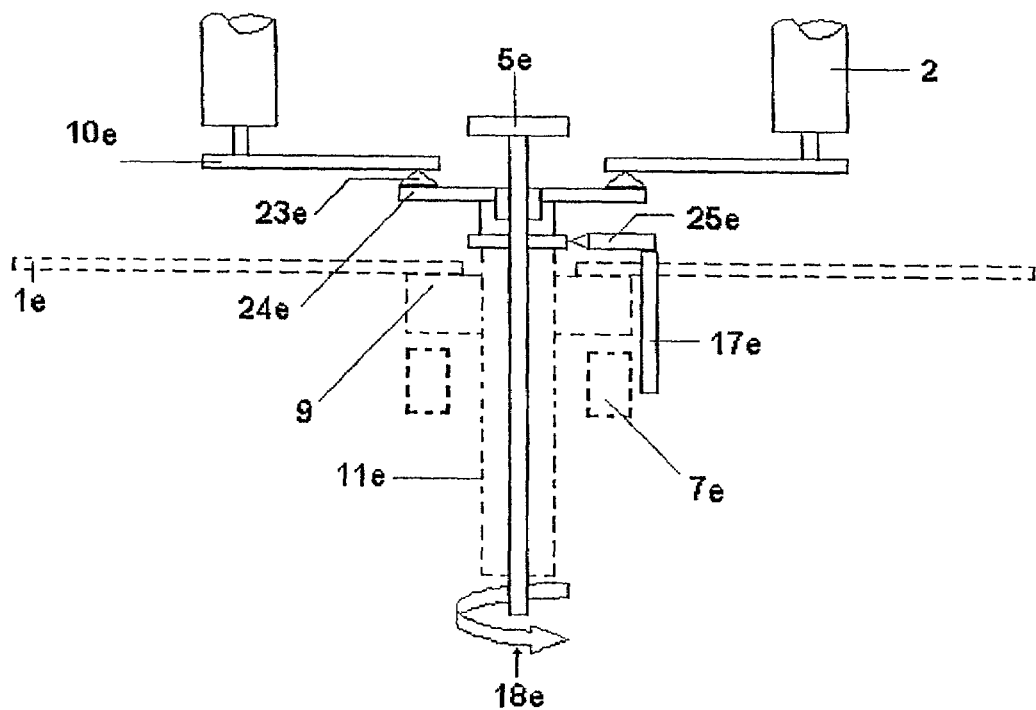
FIG. 5 is a more detailed illustration of the vacuum system shown in FIG. 3 and including an anode positioned above a receiving device base plate.
Figure 6:
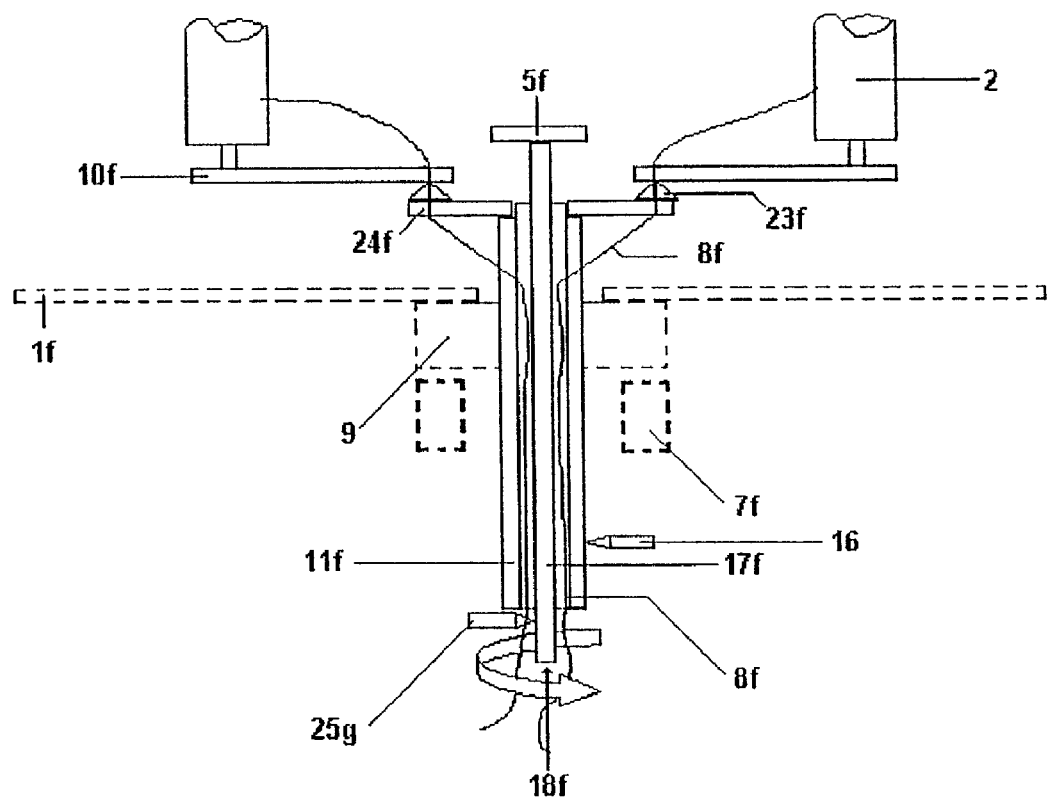
FIG. 6 illustrates a preferred embodiment of the present invention.

In the variations shown in FIGS. 5 and 6, anode 5 is fastened substantially co-planar with, or above, work piece support 10, so that a direct optical path is provided between anode 5 and ionization chamber 4. That means that in contrast with the usual dark space distances between installed structures of different potentials for plasma processes, a stable low voltage plasma can be ignited and maintained without formation of any disruptive secondary plasma.

In FIG. 5, the anode current supply 17e is provided over a rubbing contact 25e formed within the vacuum chamber. This embodiment is advantageous when no additional measurement lines are needed for the work piece support.

A particularly advantageous embodiment of the invention is shown in FIG. 6. In FIG. 6, substrate bias 16 and anode current 17f are supplied on the atmospheric side (i.e., outside the vacuum chamber) preferably by means of rubbing contacts, such as the rubbing contact 25g touching anode 5f. At least one measurement element line 8f, routed within hollow shaft 11f and rotating along therewith, is contacted on the atmospheric side by means of a sliding contact (not shown). The signal from base plate 24f onto work piece support 10f is transmitted over at least one plug contact, with the fine positioning preferably done over a centered bearing 23f having, for example, conical surfaces running into each other.

Because the coupling of work piece support 10 on the base plate 24 of the receiving device can be separated by simple raising, it is thereby possible to install a front loading opening in a PVD (physical vapor deposition) coating system provided with a centrally disposed low voltage arc discharge device. This combination results in a treatment chamber having a much lower overall height compared with other systems having the same or similar chamber volume. The resulting capability of very rapid loading and unloading is highly productive. For example, if two or more work piece supports are used, one work piece support with coated work pieces can quickly be unloaded and replaced by a work piece support with uncoated work pieces. Moreover, the second work piece support, and its associated work piece holders, can be loaded during the coating process for the first work piece support.

An additional major advantage of the central arrangement of the low volt arc discharge arrangement results from the fact that additional ionization can be achieved when necessary, including during the coating process, particularly during the transition from the etching to the coating process. This has often proven advantageous, particularly with reactive gas sputter processes. For example, that also allows defined nanolaminar structures having different coating compositions to be deposited.

With this flexible PVD system it is now possible for the first time to carry out coating processes or flowing transitions between low voltage arc etching and coating processes. In addition, a low voltage arc discharge device disposed in such fashion can be used to warm the work pieces to process temperature, when needed. Likewise, the present invention permits one to carry out sputter and arc coating processes, either separately, in sequence, or mixed, and at the same time to provide plasma pretreatment or plasma support by a central low voltage arc plasma, all without interrupting processing.

Those skilled in the art will now appreciate that an improved vacuum treatment system has been described herein. While the present invention has been described with respect to preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

We claim:

1. A vacuum system for the treatment of work pieces comprising in combination:
   a. an evacuatable treatment chamber having a bottom wall and having a central axis substantially perpendicular to said bottom wall, said treatment chamber also having at least one lateral wall;
   b. a low voltage arc discharge arrangement disposed within said treatment chamber substantially along the central axis thereof;
   c. a receiving device extending through the bottom wall of said treatment chamber about the central axis of said treatment chamber, the receiving device having opposing upper and lower ends, the upper end of said receiving device being disposed within said treatment chamber;
   d. a work piece support on which work pieces are mounted, said work piece support resting upon, and being separably linked to the upper end of said receiving device for allowing the work piece support, and the work pieces mounted thereto, to be lifted vertically relative to the receiving device, said work piece support having a cross section; and
   e. said treatment chamber having a laterally-extending closeable opening, said closeable opening having a cross section that is greater than the cross section of said work piece support so that said work piece support, and the work pieces mounted thereto, can be removed from said treatment chamber through said closeable opening by raising said work piece support off of the upper end of said receiving device.

2. The vacuum system recited by claim 1 further including at least one coating source attached to said lateral wall of said treatment chamber.

3. The vacuum system recited by claim 1 wherein said work piece support includes at least one guide pin, and said receiving device includes at least one recess for receiving said guide pin.

4. The vacuum system recited by claim 3 wherein said guide pin is a self-centering mandrel, and wherein said recess is a bore hole for receiving said mandrel, and wherein lifting of said work piece support separates said mandrel from said bore hole, and wherein lowering the work piece support onto the upper end of said receiving device engages said mandrel with said bore hole to produce a separable link therebetween.

5. The vacuum system recited by claim 1 wherein the work piece support is rotatably disposed about the central axis of said treatment chamber.

6. The vacuum system recited by claim 1 wherein said receiving device is rotatably disposed about the central axis of said treatment chamber.

7. The vacuum system recited by claim 6 wherein said receiving device includes a hollow shaft.

8. The vacuum system recited by claim 7 wherein said low voltage arc discharge arrangement includes an anode, said vacuum system further including at least one fluid supply tube passing through said hollow shaft for communication with said anode.

9. The vacuum system recited by claim 7 wherein said low voltage arc discharge arrangement includes an anode, said vacuum system further including at least one electrical conductor passing through said hollow shalt in electrical communication with said anode.

10. The vacuum system recited by claim 7 including a source of a substrate bias potential, and further including a sliding electrical contact coupling said source of substrate bias potential to said hollow shaft for communication to said work piece support.

11. The vacuum system recited by claim 7 including at least one electrical conductor passing through said hollow shaft and passing into said treatment chamber for measuring a parameter within said treatment chamber.

12. The vacuum system recited by claim 6 further including a motor drive located outside said treatment chamber and coupled to the lower end of said receiving device for rotating said receiving device and said work piece support.

13. The vacuum system recited by claim 1 including means for determining the loading and unloading position of the work piece holder in said treatment chamber, preferably limit switches, inductive proximity switches, mechanical stops, or generically related mechanical or electromechanical devices.

14. The vacuum system recited by claim 1 including at least one separable electrical connection formed between said work piece support and the upper end of said receiving device.

15. The vacuum system recited by claim 14 wherein the separable electrical connection includes rubbing (25), sliding (26), spring, or plug contacts.

16. The vacuum system recited by claim 1 including a cooling/heating system for said treatment chamber, said cooling/heating system including a gas inlet system, a gas circulation device, and a gas heat exchanger.

17. The vacuum system recited by claim 16 wherein the cooling/heating system includes a pressure regulation device for establishing a pressure range between substantially 100 mbar and 800 mbar.

18. The vacuum system recited by claim 16 wherein the cooling/heating system uses a gas selected from the group of gases comprised by helium, nitrogen, and forming gas.

19. The vacuum system recited by claim 1 wherein said low voltage arc discharge arrangement includes an anode, and wherein said anode is attached centrically on the upper end of said receiving device.

20. The vacuum system recited by claim 19 wherein said anode includes an anode head that is detachable from the upper end of said receiving device.

21. The vacuum system recited by claim 1 including magnetic field generators attached to said treatment chamber to influence the plasma formed in said treatment chamber.

22. The vacuum system recited by claim 21 wherein said magnetic field generators are permanent magnets.

23. The vacuum system recited by claim 21 wherein said magnetic field generators are magnetic coils of the Helmholtz coil type.

24. The vacuum system recited by claim 23 wherein said magnetic coils include a pair of coils, and wherein one of said pair coils has a smaller diameter than the other and is disposed under said treatment chanter, oriented centrically round the central axis of said treatment chamber.

25. Vacuum system in accordance with claim 24 wherein said pair of coils have different numbers of windings from each other, and wherein the coil having the smaller diameter has a higher number of windings than the coil having the larger diameter.

* * * * *